United States Patent [19]

Hirata

[11] Patent Number: 4,471,311
[45] Date of Patent: Sep. 11, 1984

[54] DETECTOR CIRCUIT HAVING AGC FUNCTION

[75] Inventor: Hitoshi Hirata, Tokyo, Japan

[73] Assignee: Pioneer Electronic Corporation, Tokyo, Japan

[21] Appl. No.: 368,068

[22] Filed: Apr. 13, 1982

[30] Foreign Application Priority Data

Apr. 16, 1981 [JP] Japan ............................ 56-54943[U]

[51] Int. Cl.³ .......................... H03D 1/06; H03D 1/18
[52] U.S. Cl. ................................... 329/101; 329/168;
329/178; 330/254; 455/337
[58] Field of Search ............... 329/101, 102, 109, 134,
329/136, 178; 330/254, 279, 280, 281; 455/337;
329/168, 169, 179, 135

[56] References Cited

U.S. PATENT DOCUMENTS

| | | | |
|---|---|---|---|
| 3,488,599 | 1/1970 | Csicsatka | 329/178 |
| 3,681,614 | 8/1972 | Kroos | 330/252 |
| 4,048,569 | 9/1977 | Yamatani | 330/254 |
| 4,297,645 | 10/1981 | Tanaka et al. | 330/280 |
| 4,318,050 | 3/1982 | Okanobu | 329/169 |
| 4,342,000 | 7/1982 | Ogita | 455/337 |
| 4,360,787 | 11/1982 | Galpin | 330/279 |
| 4,396,891 | 8/1983 | Johansson et al. | 330/254 |

FOREIGN PATENT DOCUMENTS 5563112  5/1980  Japan .............................. 330/254

*Primary Examiner*—John S. Heyman
*Assistant Examiner*—Timothy P. Callahan
*Attorney, Agent, or Firm*—Sughrue, Mion, Zinn, Macpeak and Seas

[57] ABSTRACT

An AM detector circuit capable of performing an AGC function having a wide dynamic range and low level of distortion and spurious interference. A first differential amplifier receives an amplitude-modulated signal to be detected as differential inputs. Outputs of the first differential amplifier are connected as constant current source inputs to second and third differential amplifiers. The differential inputs of the second and third differential amplifiers are fed with a signal synchronous with the carrier wave of the amplitude-modulated signal. Outputs of the second and third differential amplifiers are interconnected to provide multiplication outputs representing the product of the amplitude-modulated signal and its carrier wave. The detector AM signal is passed through a low-pass filter and then through a fourth differential amplifier to a current mirror circuit. The current mirror circuit feeds parallel-connected transistors of opposite conductivity types connected across the differential input of the first differential amplifier to provide the AGC function.

7 Claims, 3 Drawing Figures

DETECTOR CIRCUIT HAVING AGC FUNCTION

BACKGROUND OF THE INVENTION

The invention relates to an AM detector circuit. More particularly, the invention relates to a synchronous detector circuit having an AGC function or capability.

It is essential for an AM detector circuit to be provided with an AGC (automatic gain control) circuit. An AGC circuit in which the output level of an AM detector circuit is detected and the gain of an amplifier controlled according to the output level thus detected and an AGC circuit utilizing a current division technique and employing a differential amplifier have been extensively employed for such AM detector circuits. In both of the described prior art circuits, the dynamic range is limited. Accordingly, if the input signal to the circuit is large, the input level tends to saturate and therefore cause various types of distortion and increase the amount of spurious interference.

Accordingly, an object of the invention is to provide an AM detector circuit having an AGC function in which the above-described drawbacks accompanying a conventional AM detector circuit have been eliminated and very little signal distortion is caused.

SUMMARY OF THE INVENTION

In accordance with the invention, an AM detector circuit is provided which produces an AM detection output by multiplying together an amplitude-modulated signal and signals synchronous with the carrier wave of the amplitude-modulated signal. A pair of parallel-connected transistors of opposite conductivity types are connected to the differential input terminals of a differential amplifier which receives the amplitude-modulated signal as differential inputs to thus form a multiplier. The pair of transistors are controlled by an ACG signal which is provided according to the AM detection output.

More specifically, in accordance with the invention, there is provided an AM detector circuit including a first differential amplifier receiving the signal to be detected on differential inputs thereof. Differential outputs of the first differential amplifier are connected as constant current source inputs to second and third differential amplifiers, respectively. The input signal to be detected is also passed through a limiter to produce signals synchronous with the carrier wave of the amplitude-modulated signal but containing no modulation component. The limiter outputs are connected as differential inputs to both of the second and third differential amplifiers. Corresponding outputs of the second and third differential amplifiers are connected together and connected to differential inputs of an operational amplifier, the output of which provides the AM detection output. The AM detection output signal is passed through a low pass filter to extract the DC component thereof. This DC component is applied to one differential input of a fourth differential amplifier, the other differential input of which is connected to a fixed voltage source. The output of the fourth differential amplifier is passed through a current mirror circuit to a pair of parallel-connected transistors of opposite conductivity types connected across the differential inputs of the first differential amplifier. The pair of transistors provide the AGC function. The fixed biased voltage applied to the second input of the fourth differential amplifier is chosen such that the fourth differential amplifier is not activated until a predetermined level of AM detection output is reached so that there is substantially no AGC action below a predetermined input signal level.

DESCRIPTION OF THE PREFERRED EMBODIMENTS

A preferred embodiment of the invention will be described with reference to the accompanying drawings.

Figure 1:
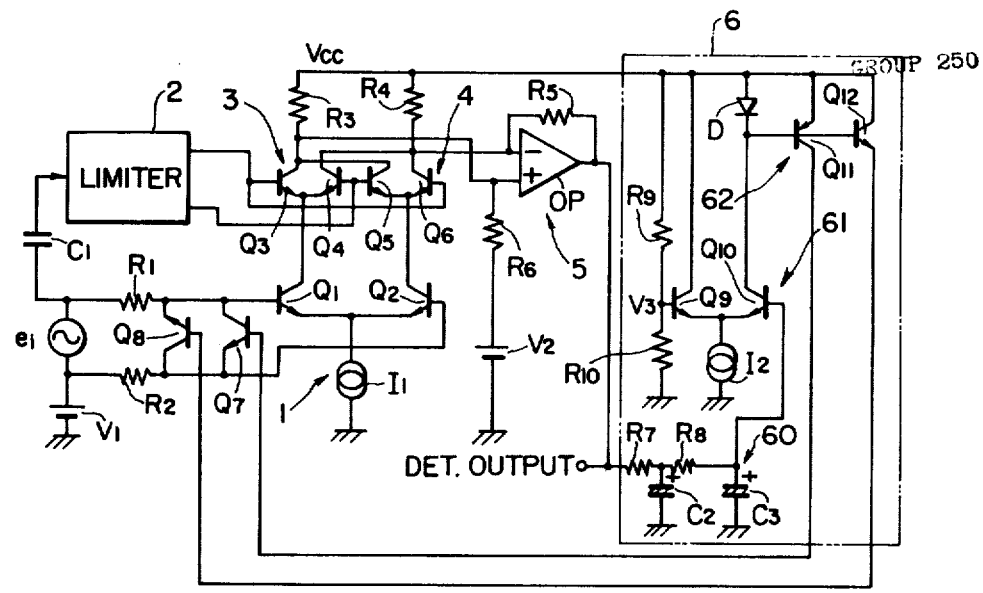
FIG. 1 is a circuit diagram of a preferred embodiment of an AM detector circuit of the invention.

FIG. 1 is a circuit diagram of an AM detector circuit of the invention. In FIG. 1, an amplitude-modulated signal $e_i$ to be detected is applied as a differential input to a first differential amplifier 1, which includes transistors $Q_1$ and $Q_2$ and a current source $I_1$, through resistors $R_1$ and $R_2$. The signal $e_i$ is further applied through a capacitor $C_1$ to a limiter 2 which removes the amplitude modulation component from the signal. A pair of differential outputs formed at the collectors of the transistors $Q_1$ and $Q_2$ are connected as current sources for second and third differential amplifiers which include transistors $Q_3$ and $Q_4$ and transistors $Q_5$ and $Q_6$, resepectively. The commone collector connecting point of the transistors $Q_3$ and $Q_5$ and the common collector connecting point of the transistors $Q_4$ and $Q_6$ are connected, respectively, through resistors $R_3$ and $R_4$ to a power source $V_{cc}$. Synchronizing signals in the form of a square wave which are synchronous with the output of the limiter 2, i.e., the carrier wave of the amplitude-modulated signal $e_i$, and which are opposite in phase to each other are applied to the bases of the transistors $Q_3$ and $Q_4$. These synchronizing signals are further applied to the bases of the transistors $Q_5$ and $Q_6$. A double-balanced type multiplier in which the amplitude-modulated signal $e_i$ and the synchronizing signals from the limiter 2 are multiplied together is formed by the above-described circuit. Thus, multiplication product signals are complementarily obtained at the commonly-connected collector outputs of the transistors $Q_3$ and $Q_5$ and of the transistors $Q_4$ and $Q_6$.

The multiplication product signals are applied to an amplifier 5, composed of an operational amplifier OP and a feedback resistor $R_5$, where they are amplified. The amplifier 5 provides an AM detection output. A reference voltage $V_2$ is applied through a resistor $R_6$ to the non-inverting input terminal of the operational amplifier OP. In this circuit arrangement, when no input is applied to the operational amplifier OP, the output voltage of the amplifier 5 is substantially equal to the bias voltage $V_2$.

In the described embodiment of the invention, a pair of transistors $Q_7$ and $Q_8$, which are parallel-connected and which are of opposite conductivity types, are provided between the differential input terminals of the first differential amplifier 1, i.e., between the bases of the transistors $Q_1$ and $Q_2$. An ACC signal generating circuit 6 for generating an AGC signal for controlling the pair of transistors $Q_7$ and $Q_8$ according to the detection output is provided.

The AGC signal generating circuit 6 includes a filter 60 composed of resistors $R_7$ and $R_8$ and capacitors $C_2$ and $C_3$ serving as a DC detector circuit for removing AC components from the detection output to obtain a DC component only, a DC amplifier 61 and in the form of a differential amplifier composed of transistors $Q_9$ and $Q_{10}$ and a current source $I_2$ for amplifying the output of the filter 60, and a current mirror circuit 62 composed of transistors $Q_{11}$ and $Q_{12}$ and a diode D for controlling the base currents of the pair of transistors $Q_7$ and $Q_8$ according to the output of the DC amplifier 61. In the DC amplifier 61, a reference voltage $V_3$ is applied to the base of the transistor $Q_9$ by means of a voltage division circuit composed of resistors $R_9$ and $R_{10}$. The value of the reference voltage $V_3$ is determined in correspondence to a predetermined input signal level and with $V_3$ being higher than $V_2$.

When an amplitude-modulated signal $e_i$ is inputted to the circuitry in FIG. 1, the signal $e_i$ is applied between the bases of the transistors $Q_1$ and $Q_2$ and is detected by the transistors $Q_3$ through $Q_6$. The detected DC and AC components become a detection output after being amplified to a predetermined level by the amplifier.

Figure 2A:
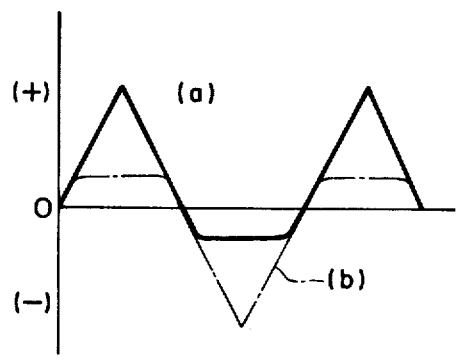
FIGS. 2A and 2B are waveform diagrams for a description of the operation of a pair of transistors in the circuit of FIG. 1.
Figure 2B:
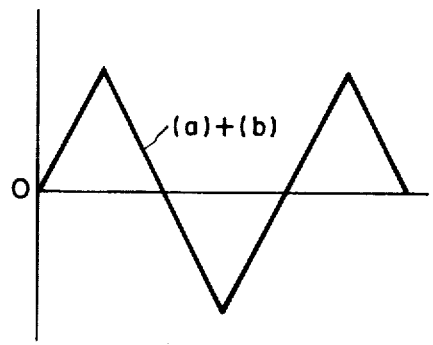

The AC component is removed from the detection output of the filter 60 so that only the DC component is applied to the base of the transistor $Q_{10}$ in the DC amplifier 61. However, when no input signal is applied, the DC amplifier 61 does not operate because the output voltage of the amplifier 5 is substantially $V_2$ and the bias voltage $V_3$ ($V_3 > V_2$) is applied to the base of the transistor $Q_9$. As the input signal increases, the DC voltage applied to the base of the transistor $Q_{10}$ is increased. When the DC voltage reaches the reference voltage $V_3$, the DC amplifier 61 starts operation and therfore current starts flowing in the current mirror curcuit 62. Accordingly, the pair of transistors $Q_7$ and $Q_8$, the bases of which are connected to the collectors of the transistors $Q_{11}$ and $Q_{12}$, respectively, in the current mirroir circuit 61, are gradually rendered conductive and reduce the input signal level. In this connection, as shown in FIG. 2A, a current flows in the transistor $Q_7$ in the positive swing, but the current is clipped in the negative swing because the collector-emitter of the transistor $Q_7$ is reversely biased (as indicated by the solid line a in FIG. 2A). On the other hand, the operation of the transistor $Q_8$ is completely opposite that of the transistor $Q_7$ described above (as indicated by the chain line b in FIG. 2A). By combining the currents of the two transistors $Q_7$ and $Q_8$, a composite current of low distortion is obtained as shown in FIG. 2B.

As is apparent from the above description, according to the invention in which an AGC circuit is provided using a pair of parallel-connected transistors of opposite conductivity types, the amount of signal distortion is remarkably decreased. Furthermore, with the circuitry of the invention, the input signal level is automatically decreased so that the dynamic range of the detection circuit is substantially increased.

I claim:

1. An AM detector circuit having an AGC function comprising: a first differential amplifier receiving an amplitude-modulated signal as differential inputs; second and third differential amplifiers coupled to said first differential amplifier, first and second differential outputs of said first differential amplifier being coupled as constant current sources to said second and third differential amplifiers, respectively, and said second and third differential amplifiers each receiving as differential inputs signals synchronous with a carrier wave of said amplitude-modulated signal, said first through third differential amplifiers producing an AM detection output by multiplying together said amplitude-modulated signal and said synchronous signals; a pair of parallel-connected transistors of opposite conductivity types provided between differential input terminals of said first differential amplifier; and an AGC signal generating circuit for producing an AGC signal according to said AM detection output, said pair of transistors being coupled so as to be controlled by said AGC signal.

2. The AM detector circuit as claimed in claim 1, wherein said AGC signal generating circuit comprises: a DC detection circuit for detecting a DC component of said AM detection output; a DC amplifier for amplifying an output of said DC detection circuit; and a current mirror circuit for controlling base currents of said pair of transistors according to an output of said DC amplifier.

3. The AM detector circuit as claimed in claim 2, further comprising means for applying a bias to said DC amplifier such that said DC amplifier is inoperative for levels of said amplitude-modulated signal below a predetermined level.

4. The AM detector circuit of claim 3, further comprising operational amplifier means receiving on a first input terminal thereof interconnected first differential outputs of said second and third differential amplifiers and receiving on a second input terminal thereof interconnected second differential outputs of said second and third differential amplifiers; and means for applying a fixed bias to one of said first and second input terminals, said AM detection output being provided at an output of said operational amplifier.

5. The AM detector circuit of claim 4, wherein said bias applied to said DC amplifier is less than said bias applied to said one of said first and second input terminals of said operational amplifier.

6. An AM detector circuit having an AGC function comprising: a first differential amplifier receiving an amplitude-modulated signal as differential inputs; second and third differential amplifiers coupled to said first differential amplifier, first and second differential outputs of said first differential amplifier being coupled as constant current sources to said second and third differential amplifiers, respectively; a limiter circuit receiving said amplitude-modulated signal and producing differential synchronous signals synchronous with a carrier wave of said amplitude-modulated signal, said differential synchronous signals being applied as differential inputs to each of said second and third differential amplifiers; an operational amplifier having an inverting input terminal coupled to first differential outputs of said second and third differential amplifiers and a non-inverting input terminal coupled to second differential outputs of said second and third differential amplifiers, and AM detection output being provided on an output of said operational amplifier; means for applying a fixed first bias voltage to said non-inverting input of said operational amplifier; low-pass filter means for extracting a DC component from said AM detection output at said output of said operation amplifier; a fourth differential amplifier receiving a DC component output from said low-pass filter at a first differential input thereof; means for applying a fixed second bias voltage, greater than said first bias voltage, to a second differential input of said fourth differential amplifier; a current mirror circuit having an input coupled to an output of said fourth differential amplifier, said current mirror circuit comprising a diode connected in a collector lead of one transistor of said fourth differential amplifier and first and second transistors having base and emitter terminals connected, respectively, across said diode; third and fourth transistors, said third and fourth transistors being coupled across a differential input of said first differential amplifier, said third and fourth transistors being parallel-connected and being of opposite conductivity types, a base of said third transistor being connected to a collector of said first transistor and a base of said fourth transistor being connected to a collector of said second transistor.

7. The AM detector circuit of claim 2, further comprising operational amplifier means receiving on a first input terminal thereof interconnected first differential outputs of said second and third differential amplifiers and receiving on a second input terminal thereof interconnected second differential outputs of said second and third differential amplifiers; and means for applying a fixed bias to one of said first and second input terminals, said AM detection output being provided at an output of said operational amplifier.

* * * * *